(12) United States Patent
Furuya et al.

(10) Patent No.: US 12,257,595 B2
(45) Date of Patent: Mar. 25, 2025

(54) PROCESSING LIQUID SUPPLY DEVICE, SUBSTRATE PROCESSING APPARATUS, AND PROCESSING LIQUID SUPPLY METHOD

(71) Applicant: SHIBAURA MECHATRONICS CORPORATION, Kanagawa (JP)

(72) Inventors: Masaaki Furuya, Kanagawa (JP); Hiroaki Kobayashi, Kanagawa (JP); Hideki Mori, Kanagawa (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 211 days.

(21) Appl. No.: 18/119,401

(22) Filed: Mar. 9, 2023

(65) Prior Publication Data
US 2023/0286013 A1   Sep. 14, 2023

(30) Foreign Application Priority Data
Mar. 10, 2022   (JP) .................. 2022-037353

(51) Int. Cl.
  *B05C 11/10*   (2006.01)
(52) U.S. Cl.
  CPC ...... *B05C 11/1007* (2013.01); *B05C 11/1036* (2013.01); *B05C 11/1042* (2013.01); *B05C 11/1047* (2013.01)
(58) Field of Classification Search
  CPC .................................................. B05C 11/1007
  See application file for complete search history.

(56) References Cited

U.S. PATENT DOCUMENTS

| 8,038,799 | B2 * | 10/2011 | Nagai | G03F 7/423 438/689 |
| 10,211,063 | B2 * | 2/2019 | Hinode | H01L 21/6708 |
| 10,312,115 | B2 * | 6/2019 | Namba | H01L 21/67017 |
| 10,580,668 | B2 * | 3/2020 | Hinode | H01L 21/6708 |
| 11,676,828 | B2 * | 6/2023 | Muraki | H01L 21/6708 438/5 |
| 2012/0074102 | A1 * | 3/2012 | Magara | H01L 21/6708 156/345.23 |
| 2019/0091640 | A1 * | 3/2019 | Nishide | H01L 21/32134 |

FOREIGN PATENT DOCUMENTS

| JP | 6324775 B2 | 5/2018 |
| TW | 201936274 A | 9/2019 |

* cited by examiner

*Primary Examiner* — Umashankar Venkatesan
(74) *Attorney, Agent, or Firm* — Venjuris, P.C.

(57) ABSTRACT

According to one embodiment, a processing liquid supply device includes a plurality of tanks, a supply path that supplies a processing liquid to a processing device, a heating unit that heats the processing liquid, a dilution unit that dilutes the processing liquid, a new-liquid supply unit that supplies a new liquid, a common flow path through which the processing liquid of the plurality of tanks passes, a switching unit that switches between the plurality of tanks so that at least a tank is selected from which the processing liquid passes to the common flow path, a densitometer provided in the common flow path, and a control device that controls at least one of the heating unit, the dilution unit, and the new-liquid supply unit so that the concentration reaches a target value set in advance.

9 Claims, 3 Drawing Sheets

PROCESSING LIQUID SUPPLY DEVICE, SUBSTRATE PROCESSING APPARATUS, AND PROCESSING LIQUID SUPPLY METHOD

CROSS-REFERENCE TO RELATED APPLICATIONS

The present application is based on and claims priority from Japanese Patent Application No. 2022-037353, filed on Mar. 10, 2022, with the Japan Patent Office, the disclosure of which is incorporated herein in its entirety by reference.

TECHNICAL FIELD

The present disclosure relates to a processing liquid supply device, a substrate processing apparatus, and a processing liquid supply method.

BACKGROUND

In a manufacturing process of semiconductors, flat panel displays, etc., a processing device is used to perform an etching process by supplying an etching processing liquid to a film formed on a surface of a substrate such as a semiconductor wafer or a glass substrate thereby forming a desired circuit pattern on the substrate.

For example, with the recent miniaturization of circuit patterns, a single-wafer type processing device in which a processing liquid is supplied to a rotating substrate to process substrates one by one may have a higher level of uniformity in a processing for each substrate than a batch type processing device in which several substrates are immersed in a processing liquid to process the substrates in a batch, and therefore, is widely used.

SUMMARY

An embodiment of the present disclosure is a processing liquid supply device configured to supply a processing liquid to a processing device that processes a substrate with the processing liquid. The processing liquid supply device includes a plurality of tanks configured to store the processing liquid therein, a supply path configured to connect the plurality of tanks so as to enable the processing liquid to pass between the plurality of tanks and to supply the processing liquid to the processing device by sequentially passing through the plurality of tanks, a heating unit configured to heat the processing liquid, a dilution unit configured to dilute the processing liquid with a diluent, a new-liquid supply unit configured to supply a new processing liquid, a common flow path through which the processing liquid of the plurality of tanks passes, a switching unit configured to switch between the tanks so that a specific tank is selected from which the processing liquid from the selected tank passes to the common flow path, a densitometer provided in the common flow path, and a control device configured to cause the densitometer to measure the concentration of the processing liquid in each of the tanks while switching between the tanks by the switching unit, and to control at least one of the heating unit, the dilution unit, and the new-liquid supply unit so that the concentration of the processing liquid reaches a target value set in advance.

A substrate processing apparatus according to an embodiment of the present disclosure includes the processing device and the processing liquid supply device.

An embodiment of the present disclosure is a processing liquid supply method of supplying a processing liquid to a processing device that processes a substrate with the processing liquid by sequentially switching between a plurality of tanks. The processing liquid supply method includes measuring the concentration of the processing liquid for each of the tanks by a densitometer provided in a common flow path through which the processing liquid of the plurality of tanks passes while switching between the plurality of tanks so that a specific tank is selected from which the processing liquid passes to the common flow path, and adjusting the concentration of the processing liquid by controlling at least one of a heating unit configured to heat the processing liquid, a dilution unit configured to dilute the processing liquid, and a new-liquid supply unit configured to supply the new processing liquid so that the concentration of the processing liquid reaches a target value set in advance.

Embodiments of the present disclosure may provide a processing liquid supply device, a substrate processing apparatus, and a processing liquid supply method capable of minimizing the costs, preventing the occurrence of non-uniformity in measured values of the concentration of a processing liquid in each tank and adjusting the concentration of the processing liquid to be supplied.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENTS

Figure 1:
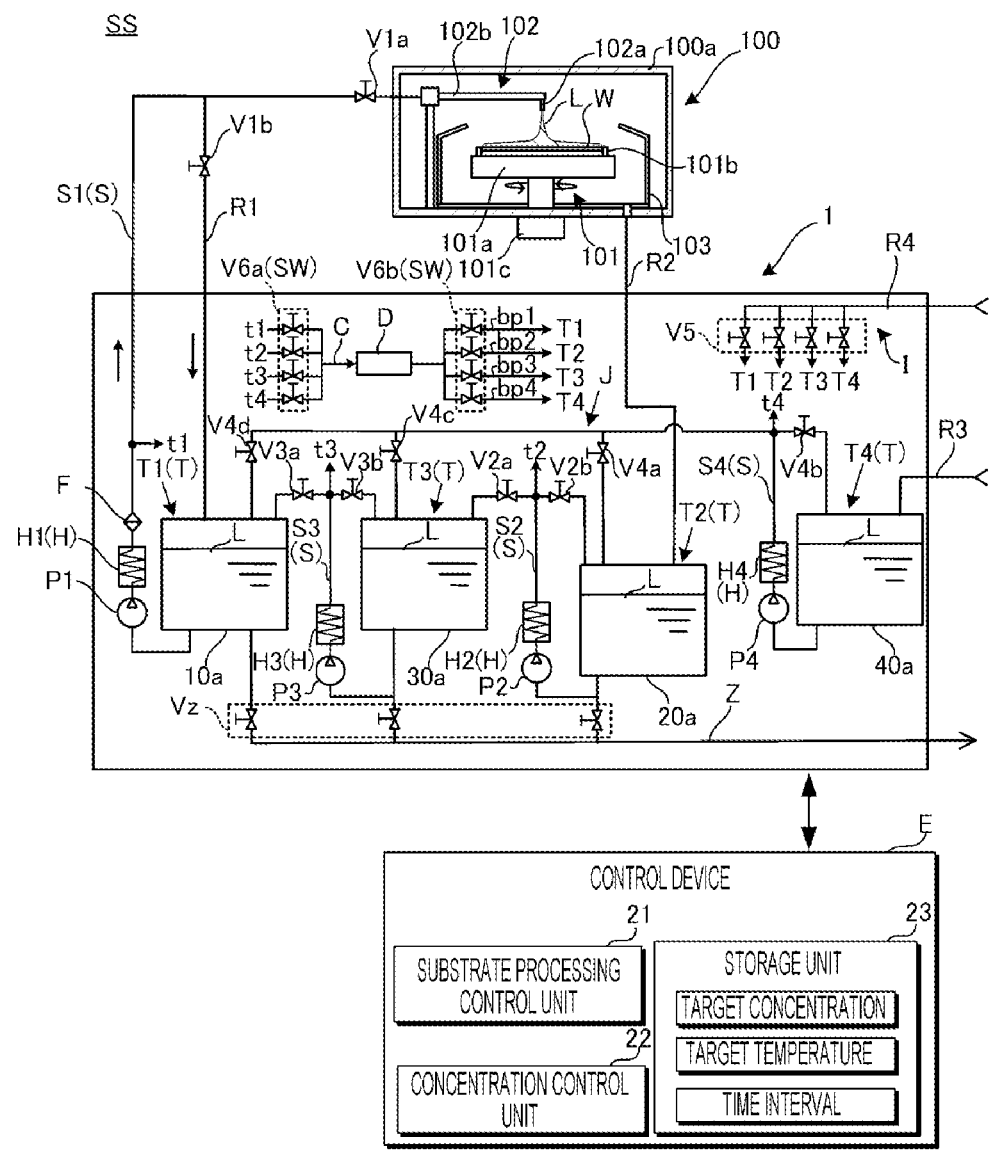
FIG. 1 is a schematic diagram illustrating a configuration of a processing device and a processing liquid supply device according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

The single-wafer type processing device, which processes one sheet of substrate at a time, has a relatively low productivity as compared to the batch type processing device unless the processing time for each sheet of substrate is shortened in the single-wafer type processing device. For this reason, in order to increase the productivity in the single-wafer type processing device while maintaining a high processing performance, the processing needs to be performed within a short time period with little fluctuation in the single-wafer type processing device. In the batch type processing device, the fluctuations in parameters such as the temperature and concentration of the processing liquid may be adjusted inside a processing bath by taking time before a processing, and the substrates may then be immersed. However, in the single-wafer type processing device, the processing liquid needs to be supplied to the substrate in such a way that the parameters affecting the process performance are always kept constant.

Further, in the batch type processing device or single-wafer type processing device, the processing liquid used in the processing may need to be recovered and reused from the viewpoint of reducing the processing costs. Even in the case of reusing the processing liquid, the batch type processing device may check and adjust the parameters within a relatively long processing time of immersion in the processing bath. However, the single-wafer type processing device processes each substrate in a relatively short time. Therefore, the fluctuations in the parameters of the processing liquid supplied to the substrate causes a non-uniformity in the processing performance for processing the substrate, and the non-uniformity appears in products. For this reason, the processing liquid, including the recovered processing liquid, always needs to be adjusted to the optimum concentration or temperature, to be continuously supplied to the substrate. In other words, in the single-wafer type processing device, the fluctuations in the concentration and temperature of the processing liquid always needs to be suppressed within a very small range.

In general, the recovered liquid tends to greatly affect the fluctuation in the temperature of the processing liquid. In other words, since the temperature of the processing liquid used in the processing decreases, the used processing liquid needs to be recovered and the temperature of the recovered processing liquid needs to be raised again. However, a specific measure is required in order to maintain and supply the recovered liquid at a relatively high temperature. For example, since the amount of recovered liquid fluctuates at the processing timing, a predetermined recovery amount is not always recovered in a predetermined period. In particular, when a processing is performed in a plurality of processing chambers at the same time, the substrate processing timing in each processing chamber fluctuates, and thus, the recovery amount also fluctuates greatly over the time. In a configuration in which the recovered liquid is collected, heated and reused in a tank, the temperature fluctuates greatly according to the inflow amount of the recovered liquid.

In contrast, regarding the concentration of the processing liquid, since the concentration needs to be adjusted by heating the processing liquid over an extended period of time or by adding a diluent such as pure water, the adjustment is performed in a supply tank. Since the recovered liquid is converted into the processing liquid by adjusting the concentration in the supply tank, the range for the concentration adjustment tends to be relatively small. However, when the processing liquid is expensive and in order to increase the recovery rate of the processing liquid and reduce the processing cost, even a processing liquid mixed with a certain amount of liquid having no difficulty in reuse such as a rinse liquid is recovered and reused. For this reason, it is important to restore the concentration of the processing liquid that has been used in the processing.

Even if the concentration of the recovered liquid is necessarily low, in a recovery tank where no processing is performed for an extended period of time and a newly recovered liquid does not flow into, heating is always performed to maintain the liquid in the recovery tank at a high temperature, so that the concentration of the recovered liquid increases over the time period. Since the substrate processing is not performed while the recovered liquid does not flow into, the amount of liquid in the supply tank, which sends the recovered liquid to the recovery tank, does not decrease, which further increases the concentration in the recovery tank. Accordingly, concentration control is also important in the recovery tank.

A substrate processing apparatus as described in Japanese Patent No. 6324775 has been proposed as a method of preventing the temperature fluctuation and concentration fluctuation in the recovery and reuse of a processing liquid in such a single-wafer type. The substrate processing apparatus includes a supply tank that supplies the processing liquid to a processing unit, a recovery tank that recovers the processing liquid that has been used completely in a processing, and an adjustment tank that enables the reuse of the recovered liquid. The recovery tank, after recovering the processing liquid, serves as the adjustment tank performing temperature adjustment and concentration adjustment of the processing liquid, and the tank, which has been used as the adjustment tank, is converted into and used as the recovery tank. Thus, the recovered processing liquid and the processing liquid having the adjusted temperature and concentration may be continuously provided to the supply tank. Further, each tank may be efficiently operated without idle for the concentration adjustment of the processing liquid by using two tanks into which the recovered liquid flows while sequentially switching between the two tanks.

In the above-described technology, by using two recovery tanks with respect to one supply tank while switching the purpose of two recovery tanks between recovery and concentration adjustment, control may continue until the temperature and concentration fall within a target range and then, the supply of the processing liquid to the supply tank is finished. In such a device, each adjustment tank is provided with a densitometer, so that the concentration of the processing liquid is adjusted using each densitometer when adjusting the processing liquid in each tank.

However, when each tank is provided with the densitometer, the measured values displayed on respective densitometers causes a difference due to an individual difference between the densitometers. That is, there exists non-uniformity in the measured values of the respective densitometers. Since the non-uniformity in the measured values of the respective densitometers results in a deviation in control for seeking a common target value, the measured values may not actually converge to a target value even if the measured values match. In order to eliminate such non-uniformity, each densitometer needs to be adjusted, but the adjustment takes time and deteriorates the productivity. Further, by providing each tank with the densitometer, the device configuration is enlarged and the costs increases.

Embodiments of the present disclosure are intended to provide a processing liquid supply device, a substrate processing apparatus, and a processing liquid supply method capable of minimizing costs, preventing the occurrence of non-uniformity in measured values of the concentration of a processing liquid in each tank, and adjusting the concentration of the processing liquid to be supplied.

Hereinafter, embodiments of the present disclosure will be described with reference to the drawings.

[Outline]

As illustrated in FIG. 1, a processing liquid supply device 1 of an embodiment is a device that supplies a processing liquid L to a processing device 100, which processes a substrate W with the processing liquid L, by sequentially passing through a plurality of tanks T. In the processing liquid supply device 1, one densitometer D is provided in a common flow path C through which the processing liquid L passes from the plurality of tanks T. While the tanks T, from which the processing liquid L passes to the common flow path C, are switched by a switching unit SW, the concentration of the processing liquid L in each tank T is measured, and the addition amount of a diluent to the processing liquid L in each tank T and the heating temperature of the processing liquid L are adjusted so that the processing liquid L in each tank T reaches a predetermined target concentration. In the following description, an apparatus that performs a processing while circulating the processing liquid L between the processing liquid supply device 1 and the processing device 100 is referred to as a substrate processing apparatus SS.

[Processing Device]

The processing device 100 is a single-wafer type etching device that removes an unnecessary film and leaves a circuit pattern by supplying the processing liquid L to, for example, a rotating substrate W. In the following description, an active ingredient for a processing in the processing liquid L is referred to as a chemical liquid. Further, the concentration is the concentration of the chemical liquid included in the processing liquid L. In the present embodiment, an aqueous solution (hereinafter referred to as a phosphoric acid solution) including phosphoric acid ($H_3PO_4$), which is the chemical liquid, is used as the processing liquid L. The phosphoric acid solution needs to be at a high temperature in order to secure a processing rate, and it is highly necessary to prevent a temperature drop. However, the processing liquid L to be used is not limited to this, and for example, an acid-based liquid such as a mixed liquid of hydrofluoric acid and nitric acid or a mixed liquid of acetic acid, sulfuric acid, and hydrogen peroxide (sulfuric acid hydrogen peroxide mixture: SPM) may be widely used as the processing liquid L.

The processing device 100 is a single-wafer type device that processes the substrates W one by one. The processing device 100 includes a rotation unit 101, a supply unit 102, and a recovery unit 103, which are configured in a chamber 100a as a container. The rotation unit 101 includes a rotating body 101a and a drive source 101c. The rotating body 101a is a rotating table that holds a peripheral edge of the substrate W with a holder 101b such as a chuck pin, and rotates about an axis orthogonal to the substrate W. The drive source 101c is a motor that rotates the rotating body 101a.

The supply unit 102 includes a nozzle 102a and an arm 102b. The nozzle 102a is a discharger that discharges the processing liquid L toward a processing surface of the rotating substrate W. The arm 120b is provided at the tip thereof with the nozzle 102a, and swings the nozzle 102a between a position above the center of the rotating body 101a and a position retracted from the rotating body 101a. The nozzle 102a is connected to the processing liquid supply device 1 via a supply pipe S1 to be described later, and the processing liquid L is supplied to the nozzle 102a.

The recovery unit 103 is a housing that is provided to surround the rotating body 101a, and recovers, from the bottom thereof, the processing liquid L supplied from the nozzle 102a to the processing surface of the substrate W and leaked from an end surface of the substrate W. Openings are formed in the bottom of the recovery unit 103 and the bottom of the chamber 100a. These openings are connected to the processing liquid supply device 1 via a recovery pipe R2 to be described later.

[Processing Liquid Supply Device]

The processing liquid supply device 1 supplies the processing liquid L to the processing device 100. Further, the processing liquid supply device 1 recovers the processing liquid L used completely in the processing device 100, and supplies the processing liquid L to the processing device 100 together with a newly supplied processing liquid L. Although not illustrated in FIG. 1, a plurality of processing devices 100 are provided for one processing liquid supply device 1.

The processing liquid supply device 1 includes the tank T, a supply path S, a heating unit H, a dilution unit I, the common flow path C, the densitometer D, and a control device E. The tank T stores the processing liquid L therein. The tank T includes a plurality of tanks, for example, a supply tank T1, a recovery tank T2, a buffer tank T3, and a new-liquid tank T4. Hereinafter, these T1 to T4 will be referred to as the tank T when they are not distinguished from each other.

The supply path S connects the plurality of tanks T1 to T4 to enable the processing liquid L to pass between the plurality of tanks T1 to T4, and supplies the processing liquid L to the processing device 100 by sequentially passing through the plurality of tanks T1 to T4. The supply path S includes supply pipes S1 to S4. The heating unit H heats the processing liquid L. The heating unit H includes heaters H1 to H4. Here, "sequentially passing through the plurality of tanks T" may be a configuration in which the processing liquid L passes through two or more of the plurality of tanks T storing the processing liquid L therein. In other words, it is sufficient that at least two tanks T are connected to each other to enable the processing liquid L to pass therebetween.

(Supply Tank)

The supply tank T1 includes a container 10a, and stores the processing liquid L to be supplied to the processing device 100 in the container 10a. The container 10a is formed of a material having corrosion resistance to the processing liquid L. The supply pipe S1 and a return pipe R1 are connected to the supply tank T1. The supply pipe S1 is a pipe that is connected to the bottom of the container 10a and supplies the processing liquid L to the supply unit 102 of the processing device 100.

A pump P1, the heater H1, a filter F, and a valve V1a are provided on the path of the supply pipe S1. The pump P1 sucks and sends the processing liquid L from the bottom of the supply tank T1. The heater H1 is provided downstream of the pump P1 and heats the processing liquid L sent from the pump P1 to a predetermined target temperature. Here, in the flow from the supply tank T1 to the processing device 100, the side of the supply tank T1 is upstream, and the side of the processing device 100 is downstream. A temperature sensor (not illustrated) is provided downstream of the heater H1, and the output of the heater H1 is adjusted in response to feedback from the temperature sensor. The temperature sensor is, for example, a thermistor. The processing liquid L heated to the target temperature by the heater H1 is supplied to the supply unit 102 of the processing device 100.

The filter F is provided downstream of the heater H1, and removes impurities from the processing liquid L flowing through the supply pipe S1. The valve V1a is provided downstream of the filter F, and switches whether or not the processing liquid L is supplied to the processing device 100.

The return pipe R1 is branched upstream of the valve V1a in the supply pipe S1, and is connected to the supply tank T1. A valve V1b is provided in the return pipe R1. When no processing is performed on the substrate W, the processing liquid L supplied from the supply pipe S1 to the processing device 100 is returned to the supply tank T1 through the return pipe R1 by closing the valve V1a and opening the valve V1b. In other words, a circulation path is formed by the return pipe R1 and the supply pipe S1. In this circulation path, the temperature of the processing liquid L in the supply tank T1 is maintained at a constant temperature by the heating of the heater H1.

Further, although not illustrated, the supply tank T1 is provided with a liquid level sensor for detecting a liquid level. Thus, whether or not the processing liquid L in the supply tank T1 has become a certain amount or lower may be detected. A heater may be provided in the container 10a of the supply tank T1 to heat the processing liquid L to a certain temperature.

(Recovery Tank)

The recovery tank T2 includes a container 20a, and stores the processing liquid L recovered from the processing device 100 in the container 20a. The container 20a is formed of a material having corrosion resistance to the processing liquid L. The recovery pipe R2 and the supply pipe S2 are connected to the recovery tank T2. The recovery pipe R2 is a pipe that recovers the processing liquid L after etching process from the recovery unit 103 of the processing device 100.

The supply pipe S2 is connected to the bottom of the container 20a. A pump P2 and the heater H2 are provided in the supply pipe S2. The pump P2 sucks and sends the processing liquid L from the bottom of the recovery tank T2. The heater H2 is provided downstream of the pump P2, and heats the processing liquid L sent from the pump P2 to a predetermined target temperature. Here, in the flow from the bottom of the recovery tank T2 to the buffer tank T3 to be described later, the top (return) of the recovery tank T2, or the common flow path C, the side of the bottom of the recovery tank T2 is upstream, and the opposite side is downstream. A temperature sensor (not illustrated) is provided downstream of the heater H2, and the output of the heater H2 is adjusted in response to feedback from the temperature sensor. The temperature sensor is, for example, a thermistor.

There is a branch point in the middle of the supply pipe S2, and from this branch point, the supply pipe S2 is branched into a path for feeding to the buffer tank T3 to be described later and a path returning to the recovery tank T2. Valves V2a and V2b are provided in the respective branched paths. The valve V2a switches whether or not the processing liquid L is supplied to the buffer tank T3. The valve V2b switches whether or not the processing liquid L is returned to the recovery tank T2.

The processing liquid L heated by the heater H2 normally circulates since it is returned to the recovery tank T2 by closing the valve V2a and opening the valve V2b. Thus, the heater H2 heats the processing liquid L in the recovery tank T2 to a target temperature. However, when the processing liquid L in the buffer tank T3 becomes a certain amount or lower and needs to be replenished, the processing liquid L heated to the target temperature is supplied to the buffer tank T3 by opening the valve V2a and closing the valve V2b. Thus, the recovered and reheated processing liquid L may be reused.

Further, although not illustrated, the recovery tank T2 is provided with a liquid level sensor for detecting a liquid level. Thus, whether or not the processing liquid L in the recovery tank T2 has become a certain amount or lower may be detected. Whether or not the processing liquid L is to be supplied to the buffer tank T3 may be determined by detecting whether or not the processing liquid L has become the certain amount or lower. In other words, when the processing liquid L has become the certain amount or lower, the processing liquid L is not supplied to the buffer tank T3 but continues to circulate to the recovery tank T2. Further, when the processing liquid L has exceeded the certain amount, the processing liquid L begins to be supplied to the buffer tank T3 after the temperature and concentration of the processing liquid L are adjusted. A heater may be provided in the recovery tank T2 to heat the processing liquid L to a certain temperature.

(Buffer Tank)

The buffer tank T3 includes a container 30a, and stores the processing liquid L from the recovery tank T2 in the container 30a. The container 30a is formed of a material having corrosion resistance to the processing liquid L. The supply pipe S3 and the above-described supply pipe S2 are connected to the buffer tank T3.

The supply pipe S3 is connected to the bottom of the container 30a. A pump P3 and the heater H3 are provided in the supply pipe S3. The pump P3 sucks and sends the processing liquid L from the bottom of the buffer tank T3. The heater H3 is provided downstream of the pump P3, and heats the processing liquid L sent from the pump P2 to a predetermined target temperature. Here, in the flow from the bottom of the buffer tank T3 to the supply tank T1, the top (return) of the buffer tank T3, or the common flow path C, the side of the bottom of the buffer tank T3 is upstream, and the opposite side is downstream. A temperature sensor (not illustrated) is provided downstream of the heater H3, and the output of the heater H3 is adjusted in response to feedback from the temperature sensor. The temperature sensor is, for example, a thermistor.

There is a branch point in the middle of the supply pipe S3, and from this branch point, the supply pipe S3 is branched into a path for feeding to the supply tank T1 and a path returning to the buffer tank T3. Valves V3a and V3b are provided in the respective branched paths. The valve V3a switches whether or not the processing liquid L is supplied to the supply tank T1. The valve V3b switches whether or not the processing liquid L is returned to the buffer tank T3.

The processing liquid L heated by the heater H3 normally circulates since it is returned to the buffer tank T3 by closing the valve V3a and opening the valve V3b. Thus, the heater H3 heats the processing liquid L in the buffer tank T3 to a target temperature. However, when the processing liquid L in the supply tank T1 becomes a certain amount or lower and needs to be replenished, the processing liquid L heated to the target temperature is supplied to the supply tank T1 by opening the valve V3a and closing the valve V3b.

Further, although not illustrated, the buffer tank T3 is provided with a liquid level sensor for detecting a liquid level. Thus, whether or not the processing liquid L in the buffer tank T3 has become a certain amount or lower may be detected. Whether or not to receive the processing liquid L supplied from the recovery tank T2 may be determined by detecting whether or not the processing liquid L has become the certain amount or lower. In other words, when the processing liquid has become the certain amount or lower, the processing liquid L is supplied from the recovery tank T2, and continues to circulate to the buffer tank T3 without supplying the processing liquid L to the supply tank T1. Further, when the processing liquid L has exceeded the certain amount, the temperature and concentration of the processing liquid L are adjusted to respective target values, that is, the target temperature and target concentration, without the supply of the processing liquid L from the recovery tank T2, and then the processing liquid L begins to be supplied to the supply tank T1. A heater may be provided in the buffer tank T3 to heat the processing liquid L to a certain temperature.

Furthermore, pipes, which are provided respectively with valves Vz, are connected to the bottoms of the supply tank T1, the recovery tank T2, and the buffer tank T3 described above, and are joined to a discharge path Z, which is a common pipe. The discharge path Z is connected to a waste liquid path of a factory.

(New-Liquid Tank)

The new-liquid tank T4 includes a container 40a, and stores a newly prepared processing liquid L (hereinafter, referred to as a new liquid) in the container 40a. The container 40a is formed of a material having corrosion resistance to the processing liquid L. A liquid feed pipe R3 and the supply pipe S4 are connected to the new-liquid tank T4. The liquid feed pipe R3 is a pipe that supplies the processing liquid L to the new-liquid tank T4 from a source of the processing liquid L (not illustrated).

The supply pipe S4 is connected to the bottom of the container 40a. A pump P4 and the heater H4 are provided in the supply pipe S4. The pump P4 sucks and sends the processing liquid L from the bottom of the new-liquid tank T4. The heater H4 is provided downstream of the pump P4, and heats the processing liquid L sent from the pump P4 to a predetermined target temperature. Here, in the flow from the bottom of the new-liquid tank T4 to the recovery tank T2, the buffer tank T3, the supply tank T1, the top (return) of the new-liquid tank T4, or the common flow path C, the side of the bottom of the new-liquid tank T4 is upstream, and the opposite side is downstream. A temperature sensor (not illustrated) is provided downstream of the heater H4, and the output of the heater H4 is adjusted in response to feedback from the temperature sensor. The temperature sensor is, for example, a thermistor.

The supply pipe S4 is branched into a liquid feed path for feeding to the recovery tank T2, the buffer tank T3 and the supply tank T1, and a path returning to the new-liquid tank T4. The liquid feed path is branched into the recovery tank T2, the buffer tank T3, and the supply tank T1, and valves V4a, V4c and V4d are provided in the resulting respective branched paths. The valves V4a, V4c and V4d switch whether or not the processing liquid L is sent to the recovery tank T2, the buffer tank T3, and the supply tank T1, respectively. The liquid feed path and the valves V4a, V4c and V4d are a new-liquid supply unit J that supplies a new liquid to at least one of the recovery tank T2, the buffer tank T3, and the supply tank T1. A valve V4b is provided on the path returning to the new-liquid tank T4. The valve V4b switches whether or not the processing liquid L is returned to the new-liquid tank T4.

The processing liquid L heated by the heater H4 normally circulates since it is returned to the new-liquid tank T4 by opening the valve V4b. Thus, the heater H4 heats the processing liquid L in the new-liquid tank T4 to a target temperature. Furthermore, when the new liquid becomes usable as the processing liquid L, and when the processing liquid L in the supply tank T1 becomes a certain amount or lower and the processing liquid L in the buffer tank T3 falls below a certain amount, a predetermined amount of liquid is sent to the supply tank T1 by closing the valve V4b and opening the valve V4d. Thus, the processing liquid L is supplied to the processing device 100 and used for a processing. Then, the insufficient processing liquid L is replenished from the buffer tank T3. The new liquid is supplied from the new-liquid tank T4 to the recovery tank T2 by closing the valve V4b and opening the valve V4a.

However, the supply of the new liquid to the recovery tank T2 will only be done when a situation in which the processing liquid L in the recovery tank T2 becomes a certain amount or lower and no liquid is recovered from the processing device 100 is continued so that the recovery tank T2 does not overflow with the recovered liquid and the new liquid.

The same amount of new liquid as the processing liquid L replenished from the new-liquid tank T4 to the supply tank T1 is added to the new-liquid tank T4 from the liquid feed pipe R3 before the next heating is performed. The replenishment of the new liquid to the buffer tank T3 is also performed by opening the valve V4c when the processing liquid L in the buffer tank T3 becomes a certain amount or lower and an insufficient amount of the processing liquid L is supplied from the recovery tank T2.

Further, although not illustrated, the new-liquid tank T4 is provided with a liquid level sensor for detecting a liquid level. Thus, whether or not the processing liquid L in the new-liquid tank T4 has become a certain amount or lower may be detected, and whether or not the processing liquid is to be replenished by the liquid sent from the liquid feed pipe R3 may be determined. A heater may be provided in the new-liquid tank T4 to heat the processing liquid L to a certain temperature.

(Dilution Unit)

The dilution unit I dilutes the processing liquid L with a diluent. The diluent is a liquid that decreases the concentration of the liquid in the tank T, and is pure water in the present embodiment. The dilution unit I includes a liquid feed pipe R4. The liquid feed pipe R4 is a pipe that is branched from a pure water source (not illustrated) to the supply tank T1, the recovery tank T2, the buffer tank T3, and the new-liquid tank T4, and supplies the diluent to each of them. A valve V5 is provided in each of branched pipes to the tanks T1 to T4. A predetermined amount of pure water is added to each of the tanks T1 to T4 based on the measurement of the concentration of the processing liquid L in each of the tanks T1 to T4 by the densitometer D to be described later.

(Common Flow Path)

The common flow path C is a common path through which the processing liquid L of the plurality of tanks T1 to T4 passes. The common flow path C of the present embodiment is a pipe where pipes t1 to t4 branched from supply pipes S1 to S4 join together. In other words, a branch point is formed downstream of the filter F of the supply pipe S1, and the pipe t1 is branched from this branch point. The pipe t2 is branched from a branch point of the supply pipe S2 to the buffer tank T3 and the recovery tank T2. The pipe t3 is branched from a branch point of the supply pipe S3 to the supply tank T1 and the buffer tank T3. Furthermore, the pipe t4 is branched from a branch point of the supply pipe S4 to the supply pipe S1, etc. and the new-liquid tank T4. The pipes t1 to t4 from the supply pipes S1 to S4 are provided with valves V6a, respectively. Further, the common flow path C is connected to pipes bp1 to bp4 which are branched and returned to the plurality of tanks T1 to T4. A valve V6b is provided in each of the pipes bp1 to bp4 which are branched from the common flow path C and are directed to the plurality of tanks T1 to T4. These valves V6a and V6b are a switching unit SW that switches between the tanks T1 to T4 so that a specific tank is selected from which the processing liquid L passes to the common flow path C according to which of the valves V6a and V6b is opened. In other words, the switching unit SW switches between the tanks T1 to T4 from which the processing liquid L passes to the common flow path C.

(Densitometer)

The densitometer D is provided in the common flow path C and measures the concentration of the processing liquid L flowing through the common flow path C. The feeding of the liquid to the densitometer D and the return of the liquid to the tank T are distinguished for each of the tanks T1 to T4 by the ON/OFF of the valves V6a and V6b of the switching unit SW, and are performed so that the processing liquid L does not mix between the tanks T1 to T4. In other words, the tanks are configured such that the processing liquid L coming out of any one tank T is returned to the same tank T so as to prevent the processing liquid L from mixing with that of the other tanks T accumulated in at least the common flow path C. One densitometer D of the present embodiment is provided in the common flow path C. An optical type densitometer with relatively high accuracy may be used as the densitometer D.

(Control Device)

The control device E controls each part of the substrate processing apparatus SS. The control device E includes a processor that executes programs, a memory that stores various types of information such as programs and operating conditions, and a drive circuit that drives each element, in order to realize various functions of the substrate processing apparatus SS. The control device E includes an input device for inputting information and a display device for displaying information.

The control device E includes a substrate processing control unit 21, a concentration control unit 22, and a storage unit 23. The substrate processing control unit 21 executes a processing of the substrate W by controlling each part of the processing device 100 and the processing liquid supply device 1. That is, the substrate processing control unit 21 controls the loading and unloading of the substrate W into and from the chamber 100a, the holding of the substrate W by the holder 101b, the rotation of the rotating body 101a by the drive source 101c, the swing of the nozzle 102a by the arm 102b, whether or not the processing liquid L is supplied by the ON/Off of the valves V1a and V1b, and the replenishment of the processing liquid L to each of the tanks T1 to T4 by switching the valves V2a, V2b, V3a, V3b, V4a and V4b, etc.

The concentration control unit 22 causes the densitometer D to measure the concentration of the processing liquid L in each of the tanks T1 to T4, and controls the heating unit H and the dilution unit I so that the concentration of the processing liquid L reaches a predetermined target value (target concentration). The target concentration is a predetermined range at and near a set concentration. The set concentration is, for example, 87.7%. In this concentration control, as described above, the temperature of the processing liquid L is also controlled to a predetermined target value (target temperature). The target temperature is a predetermined range at and near a set temperature. The set temperature is, for example, 160° C. The concentration control unit 22 calculates the output of the heating unit H and the addition amount of the diluent based on either or both of a difference between the measured value and the target value (target concentration or target temperature) and a change in the measured value, and controls the heating unit H and the dilution unit I. The set concentration and the set temperature are used when calculating the difference between the measured value and the target value, but the temperature and the concentration are not necessarily controlled to exactly match the set concentration and the set temperature and are sufficient to be controllable so as to fall within the target concentration range and the target temperature range. Control based on a change in the measured value means that, when there is a period during which measurement continues, the current output of the heating unit H and the current addition amount of the diluent are calculated by estimating the concentration after the period interval until the next concentration measurement is performed from the value of a change in the concentration (slope of the graph) during that measurement period. In other words, it is a method of determining the amount of adjustment based on how much the concentration decreases until the next concentration measurement time.

More specifically, the concentration control unit 22 switches the valves V6a and V6b of the switching unit SW on and off to switch between the tanks T1 to T4 for measuring the concentration. The switching between the tanks T1 to T4 is performed at predetermined time intervals set for each of the tanks T1 to T4. Further, the concentration control unit 22 controls the output of the heaters H1 to H4, which are the heating unit H, and the ON/OFF of the valve V5 of the dilution unit I, thereby performing concentration by the heating of the processing liquid L and dilution by the addition of pure water.

Setting of time intervals may make the measurement times for all the tanks T be the same or be different. For example, the measurement time for a particular tank T may be lengthened or shortened. For the tank T which requires high-precision control, the frequency of concentration measurement may be increased, or the measurement time may be lengthened. For the tank T which is sufficient to be roughly adjusted, the frequency of concentration measurement may be reduced, or the measurement time may be shortened. However, in a case of the same measurement time, it is better to increase the frequency of measurement than to lengthen the time for one measurement. This makes it possible to measure and adjust the respective concentrations in a large number of tanks T within a certain period of time, which allows the measured value corresponding to each tank T to easily converge to the target value. When switching between the tanks T for measuring the concentration, after the processing liquid L is moved so that the processing liquid L of the previous tank T accumulated in the common flow path C is substituted by the processing liquid L of the switched tank T, or after the time required for this substitution has passed, the measurement starts.

The storage unit 23 is configured in the memory and stores the target concentration, the target temperature, the time interval, etc. An operator may input desired values for the target concentration, the target temperature, and the time interval using an input device. For example, for the recovery tank T2 that recovers the processing liquid L of which fluctuations in the concentration and temperature are too large to be used for a processing, the frequency of measurement thereof may be increased compared to the other tanks T to lengthen the measurement time to enable the adjustment of the concentration. Further, the processing of the substrate W may be stabilized by increasing the frequency of measurement of the supply tank T1, which directly affects the processing of the substrate, compared to the other tanks T.

[Operation]

An operation of the substrate processing apparatus SS of the present embodiment described above will be described with reference to FIGS. 2 and 3 in addition to FIG. 1. A substrate processing method of processing the substrate W by the following procedure is also one aspect of the present embodiment.

(Substrate Processing)

First, a substrate processing by the processing device 100 will be described. The substrate W, which is a processing target, is loaded onto the rotating body 101a by a transfer robot and is held by the holder 101b. The substrate W is rotated as the drive source 101c rotates the rotating body 101a. The processing liquid L, which has attained a desired concentration and a desired temperature by the processing liquid supply device 1, is supplied from the nozzle 102a to a processing target surface of the substrate W via the opened valve V1a, thereby performing an etching processing.

After a predetermined processing time has passed, the valve V1a is closed and the supply of the processing liquid L stops. Thereafter, the rotation of the substrate W stops, and the substrate W is released from the holder 101b and is unloaded from the chamber 100a by the transfer robot.

(Supply of Processing Liquid)

Next, a processing of adjusting the processing liquid L by the processing liquid supply device 1 will be described. Before being supplied to the processing device 100, the processing liquid L in the supply pipe T1 circulates through the supply pipe S1, the return pipe R1, and the supply tank T1 in a state where the valve V1a is closed and the valve V1b is opened and is heated by the heater H1, thereby being maintained at a target temperature. Then, as described above, the processing liquid L in the supply tank T1 is supplied to the processing device 100 at the processing timing in the processing device 100 as described above.

Before being supplied to the supply tank T1, the processing liquid L in the buffer tank T3 circulates through the supply pipe S3 and the buffer tank T3 in a state where the valve V3a is closed and the valve V3b is opened and is heated by the heater H3, thereby being maintained at a target temperature. Then, when the processing liquid L in the supply tank T1 has become a certain amount or lower, the processing liquid L is supplied to the supply tank T1 by opening the valve V3a and closing the valve V3b.

Before being supplied to the buffer tank T3, the processing liquid L in the recovery tank T2 circulates through the supply pipe S2 and the recovery tank T2 in a state where the valve V2a is closed and the valve V2b is opened and is heated by the heater H2, thereby being maintained at a target temperature. Then, when the processing liquid L in the buffer tank T3 has become a certain amount or lower, the processing liquid L is supplied to the buffer tank T3 by opening the valve V2a and closing the valve V2b.

Before being supplied to the recovery tank T2, the buffer tank T3, and the supply tank T1, the processing liquid L in the new-liquid tank T4 circulates through the supply pipe S4 and the new-liquid tank T4 in a state where the valves V4a, V4c and V4d are closed and the valve V4b is opened and is heated by the heater H4, thereby being maintained at a target temperature. Then, when the amount of the processing liquid L in the buffer tank T3 falls below a certain amount and may not be supplied to the supply tank T1, and moreover, when the amount of the processing liquid L in the supply tank T1 also falls below a certain amount, a new liquid from the new-liquid tank T4 is supplied to the supply tank T1 by opening the valve V4d and closing the valve V4b. Similarly, also in the recovery tank T2 and the buffer tank T3, when the processing liquid L is insufficiently supplied and becomes a certain amount or lower, the new liquid may be supplied to the recovery tank T2 and the buffer tank T3 by opening the valves V4a and V4c.

(Concentration Control)

As described above, concentration control, which is performed while the processing liquid L is supplied to the processing device 100 by sequentially passing through the respective tanks T1 to T4, will be described. First, as described above, the concentration is measured while sequentially switching at predetermined time intervals between opening the valve corresponding to any one of respective sets t1-T1, t2-T2, t3-T3, and t4-T4 and closing the other one among the valves V6a and V6b of the switching unit SW. Thus, switching between the tanks T1 to T4 of the processing liquid L to pass to the common flow path C is performed, and the densitometer D measures the concentration of the processing liquid L to pass to the common flow path C. Thus, the processing liquid L may selectively pass from the tanks T1 to T4 to the common flow path C, so that the concentration in each of the tanks T1 to T4 may be measured at predetermined time intervals by one densitometer D.

Then, when concentration is required depending on a difference between the measured concentration and a target concentration, the output of the heaters H1 to H4 of the corresponding tanks T1 to T4 is increased. When dilution is required, a predetermined amount of pure water is added by opening the valve V5 of the pipe from the dilution unit I to the corresponding tanks T1 to T4. In the following description, "control amount" means adjusting the output of the heating unit H and the predetermined amount of added pure water according to the difference between the measured concentration and the target concentration.

Figure 2:
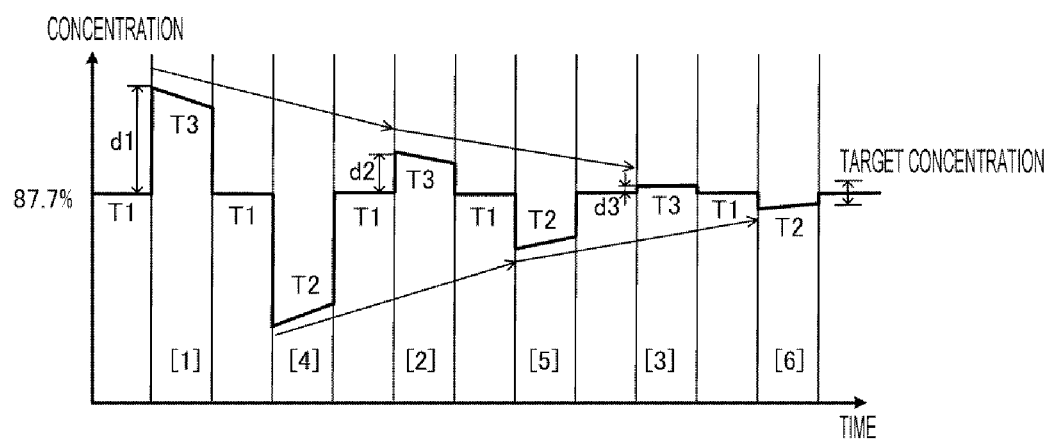
FIG. 2 is a graph illustrating an example of concentration control by the processing liquid supply device of the embodiment.

An example of such concentration control will be described with reference to the graphs of FIGS. 2 and 3. FIG. 2 is an example in which the thick solid line indicates a change in the concentration value over time when the concentration in each of the tanks T1 to T3 is measured and adjusted using the densitometer D. In this example, to clearly illustrate a change in the concentration of each of the supply tank T1, the buffer tank T3, and the recovery tank T2, the measurement of the supply tank T1 is performed on every other tank in the order of the supply tank T1, the buffer tank T3, the supply tank T1, and the recovery tank T2, and the measurement of the buffer tank T3 and the recovery tank T2 is performed on every three tanks.

First, a description will be focused on only the concentration of the processing liquid L in the buffer tank T3. Since the densitometer measures the concentration while switching between a plurality of tanks T at predetermined time intervals, changing the control amount of the concentration control of the tank T is limited to while the concentration in each tank T is being measured. In other words, the control amount of the processing liquid L in the buffer tank T3 is changed while the concentration of the processing liquid L in the buffer tank T3 is being measured ([1], [2], and [3] in the drawings).

As illustrated in [1] of FIG. 2, the concentration of the processing liquid L in the buffer tank T3 measured by the densitometer D is higher than the set concentration of 87.7%. Therefore, control is performed to decrease the concentration of the processing liquid L in the buffer tank T3 by adding pure water in an amount determined based on a difference d1 between the measured concentration and the set concentration. The addition amount of pure water is set so that the concentration does not fall below the set concentration even if the addition of pure water continues until the next measurement. Thus, the value of the concentration tends to decrease toward the target concentration even while measuring the concentration of the processing liquid L supplied from another tank T by the densitometer D. During this time, the measurement target of the densitometer D is switched to the other tank T, and the concentration in the other tank T is controlled.

The control of the concentration in the buffer tank T3 to the concentration set during the measurement is maintained until the next concentration measurement is performed. In this example, as indicated by the arrows in FIG. 2, the pure water is continuously added by the set amount between [1] and [2] and between [2] and [3]. As illustrated in [2] of FIG. 2, when the next concentration measurement of the buffer tank T3 is performed, the concentration of the processing liquid L decreases by the addition of pure water, for example, if there is no change in the amount of the processing liquid L in the buffer tank T3, thereby being changed to a value closer to the target concentration than the previously measured concentration value in [1]. Then, a smaller amount of pure water is added than the previous time based on a difference d2 between the measured concentration and the set concentration to control the concentration in the buffer tank T3. Similarly, in the next control [3], the concentration control is performed based on a difference d3 between the measured concentration and the set concentration.

In this way, even if the concentration measurement time is set short, by setting the control amount (addition amount of pure water) until the next measurement according to a difference from the set concentration at that time, and repeating this operation, the concentration may approach the target concentration. Once the concentration of the processing liquid L in the buffer tank T3 has approached the target concentration, the concentration of the processing liquid L in the buffer tank T3 may be stably maintained by setting the addition amount of water to balance an increase in concentration due to the heating of the heater H3.

When a liquid level drops as the processing liquid is sent from the buffer tank T3 to the supply tank T1, the buffer tank T3 is replenished with the liquid from the recovery tank T2, so that the concentration of the processing liquid L in the buffer tank 73 deviates from the control value. In this case, control setting depending on a newly measured concentration is performed by the next concentration measurement.

For example, in the control process of decreasing the concentration as illustrated in [1] to [3] of FIG. 2, when the concentration of the processing liquid L deviates from the target concentration in the next measurement, for example, when the concentration of the processing liquid L becomes lower than the target concentration, it is necessary to perform reverse control (heating) to restore the target concentration, thus making it difficult to stably maintain the concentration within an allowable range including the target concentration. For this reason, regarding the setting of the control amount, when it is calculated that the concentration excessively decreases and falls below the target concentration if the current amount of pure water is continuously added until the next measurement time, the addition amount of pure water is changed to prevent the concentration from falling below the target concentration. Further, for the allowable range including the target concentration, the addition amount is adjusted aiming at the upper limit of the allowable range. For example, when pure water is added based on the measured result in [1] and this addition amount is measured in [2], the addition amount of pure water until the measurement time in [3] is changed based on a change in the concentration due to the amount of pure water added in [1].

Next, a description will be focused on the supply tank T1. In the example illustrated in FIG. 2, the supply tank T1, the concentration of which is measured and controlled on every other tank, is controlled so as to be maintained at the target concentration from the beginning since it directly supplies the processing liquid L to the substrate W. In other words, it is controlled to maintain the concentration in a state where heating and water addition are balanced, but the concentration value actually fluctuates since the amount of the processing liquid L in the supply tank T1 is reduced by sending the processing liquid L to the processing device 100 and the processing liquid L is replenished from the buffer tank T3. To reduce a deviation from the target concentration, the addition of pure water and heating are performed so as to maintain the concentration even for this fluctuation. That is, the concentration is maintained within a predetermined allowable range.

Furthermore, a description will be focus on the recovery tank T2. The recovery tank T2 often requires control to increase the concentration from a value lower than the target concentration, that is, a concentration within a predetermined allowable range. This is because the recovery tank T2 has a high possibility of recovering the processing liquid at a low concentration and at a low temperature due to, for example, mixing of pure water during rinsing even if it recovers the processing liquid L. In this case, instead of adding pure water, the processing liquid L circulated by the pump P2 is heated by the heater H2 based on a difference between the measured concentration and the set concentration to evaporate moisture in the processing liquid L and increase the concentration of the processing liquid L.

The processing liquid L boils and reaches the saturation temperature by heating. Since the etching rate takes a maximum value at the saturation temperature, the target concentration is set near the saturation temperature, that is, the saturation concentration at the boiling point. However, it is set to be slightly lower than the boiling point since a processing using the processing liquid L in a boiling state is not stable. The control of a low concentration is possible by heating. The concentration may quickly approach the target concentration by increasing the output of the heater H2 as a difference between the measured concentration and the set concentration is larger.

Since such an increase in the concentration by heating from the low concentration involves boiling by heating of the circulating processing liquid L, the resistance of the pipe returning to the recovery tank T2 may need to be as small as possible to make the volumetric expansion of boiling vapor be smooth and prevent an increase in the internal pressure of the heater H2. The processing liquid L having the increased concentration by boiling is raised in temperature, and therefore, the temperature inside the recovery tank T2 also rises. It is necessary not to excessively increase the output to a heating surface area since boiling may occur in a portion of the heater in contact with the liquid when the heater is provided in the recovery tank T2.

As illustrated in [4], [5], and [6] of FIG. 2, when the measured concentration of the processing liquid L in the recovery tank T2 reaches the target concentration, the addition of pure water and heating are performed only for the purpose of compensating for the increased concentration and the reduced temperature due to moisture evaporation from the liquid surface as well as the reduced temperature due to heat radiation from the circulation line by the pump P2. This allows the concentration and temperature of the processing liquid L in the recovery tank T2 to be stably maintained within an allowable ranges. However, in practice, in addition to such concentration control, each of the tanks T1 to T4 is replenished with the processing liquid L as the processing device 100 uses the processing liquid L.

An example of a change in the concentration taking account of the replenishment of the liquid between the tanks T will be described with reference to FIG. 3. In FIG. 3, timings rp1 to rp4 for the replenishment of the processing liquid L are indicated by white circles. Further, a change in the concentration for the tank T where no concentration measurement is performed is indicated by the dashed line. As described above, when a liquid level in the supply tank T1 drops as the processing liquid L in the supply tank T1 is supplied to the processing device 100, the liquid level sensor detects this, and the processing liquid L is replenished from the buffer tank T3.

When the concentration of the processing liquid L replenished from the buffer tank T3 is higher than the target concentration, the concentration of the processing liquid L in the supply tank T1 is changed to be higher than the set concentration. However, such a change is slight if the replenished amount is less than the amount of the processing liquid L in the supply tank T1. It is assumed that, at rp1, the concentration in the buffer tank T3 is measured during the replenishment of the processing liquid L. Since a change in the concentration for the buffer tank T3 may be confirmed by measurement, the concentration is corrected taking account for this change.

Meanwhile, the concentration of the processing liquid L in the supply tank T1 is maintained in a slightly increased state but may be corrected. That is, a change in the concentration for the supply tank T1 may be roughly estimated from the measured concentration of the processing liquid L in the buffer tank T3 and the replenished amount of the processing liquid L. The control amount of the supply tank T1 is corrected by using the value of this change in the concentration. However, since there is a possibility of the correction falling within an allowable fluctuation range for the target concentration, whether or not to perform the correction may be determined after estimation. That is, no correction is performed when a change in the concentration falls within the target concentration range, whereas correction is performed when a change in the concentration deviates from the target concentration range.

Further, as at rp2 and rp4, a change in concentration may be calculated using the concentration value estimated from the control amount when the processing liquid L was replenished even if the concentration in the buffer tank T3 is not being measured. Even in this case, no correction is performed when a change in the concentration falls within the target concentration range, whereas correction is performed when a change in the concentration deviates from the target concentration range.

Furthermore, rp3 is an example of replenishing the liquid from the recovery tank T2 when a liquid level drops as the amount of the processing liquid L in the buffer tank T3 is reduced. When the concentration of the processing liquid L in the buffer tank T3 decreases since the concentration of the processing liquid L in the recovery tank T2 is lower than the target concentration, continuously maintaining the control amount of the concentration has a possibility of causing excessive correction until the next measurement. "Excessive" means, for example, a situation in which the addition amount of pure water is large and the concentration falls below the target concentration at the time of the next measurement. In this case, setting is made to reduce the addition amount of pure water and to increase the concentration (perform stronger heating). However, excessive heating again increases the addition of pure water, and the concentration fluctuates above and below the target concentration. This situation is not considered stable and needs to be avoided. Therefore, control is performed so that the addition amount of pure water is substantially constant when the concentration approaches the target concentration.

For the processing liquid L of the buffer tank T3 or the recovery tank T2, the control amount may be adjusted after the concentration measurement starts when fine concentration precision is not required, or when the switching time of the tank T may be set short. The setting may be performed after confirming the actual control state of the concentration.

Figure 3:
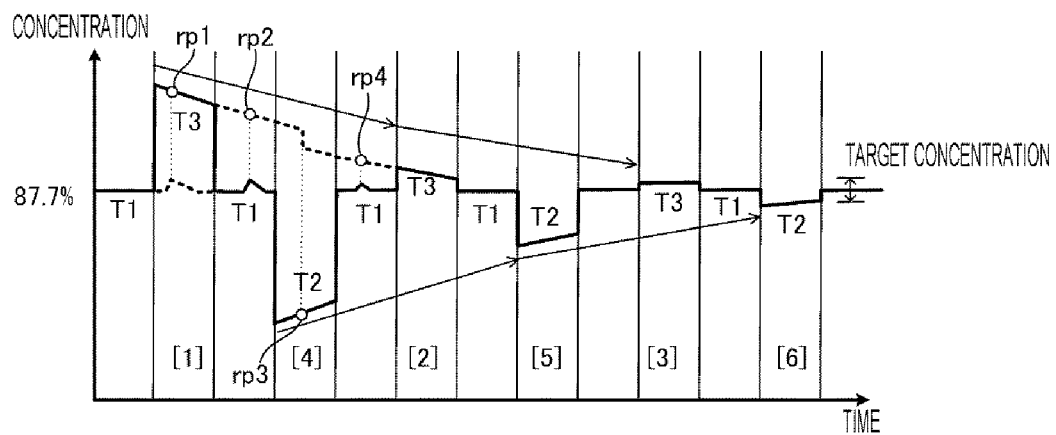
FIG. 3 is a graph illustrating another example of concentration control by the processing liquid supply device of the embodiment.

Further, in the examples illustrated in FIGS. 2 and 3 described above, the concentration measurement of the processing liquid L in the new-liquid tank T4 is not described. In the new-liquid tank T4, since it is sufficient to perform measurement after the replenished new liquid reaches a certain temperature by boiling, the concentration may be measured at predetermined intervals after reaching this state. In particular, upon the preparation of a new liquid requiring an additional waiting time such as silica dissolution, additional measurements will be taken at certain intervals after replenishment becomes possible.

[Effects]

(1) The present embodiment is a processing liquid supply device 1 configured to supply a processing liquid L to a processing device 100 that processes a substrate W with the processing liquid L. The processing liquid supply device includes a plurality of tanks T configured to store the processing liquid L therein, a supply path S configured to connect the plurality of tanks T so as to enable the processing liquid L to pass between the plurality of tanks T and to supply the processing liquid L to the processing device 100 by sequentially passing through the plurality of tanks T, a heating unit H configured to heat the processing liquid L, a dilution unit I configured to dilute the processing liquid L with a diluent, a new-liquid supply unit J configured to supply a new processing liquid L, a common flow path C through which the processing liquid L of the plurality of tanks T passes, a switching unit SW configured to switch between the tanks T so that a specific tank is selected from which the processing liquid L from the selected tank T passes to the common flow path C, a densitometer D provided in the common flow path C, and a control device E configured to cause the densitometer D to measure the concentration of the processing liquid L in each of the tanks T while switching between the tanks T by the switching unit SW, and to control at least one of the heating unit H, the dilution unit I, and the new-liquid supply unit J so that the concentration of the processing liquid L reaches a predetermined target value.

Further, the present embodiment is a processing liquid supply method of supplying a processing liquid L to a processing device 100 that processes a substrate W with the processing liquid L by sequentially passing through a plurality of tanks T, the processing liquid supply method including measuring a concentration of the processing liquid L for each of the tanks T by a densitometer D provided in a common flow path C through which the processing liquid L of the plurality of tanks T passes while switching between the tanks T of the processing liquid L passing to the common flow path C, and adjusting the concentration of the processing liquid L by controlling a heating unit H configured to heat the processing liquid L, a dilution unit I configured to dilute the processing liquid L, and a new-liquid supply unit J configured to supply a new processing liquid so that the concentration of the processing liquid L reaches a predetermined target value.

Therefore, the plurality of tanks T may be substantially measured in parallel by measuring the concentration of the processing liquid L for each of the plurality of tanks T with one concentration meter D at time intervals. Thus, one densitometer D may be shared by the plurality of tanks T, which may prevent non-uniformity in measured values caused by an individual difference of the densitometer D. Thus, the concentration of the processing liquid L in each tank T may accurately converge to the target value, resulting in an improvement in the uniformity of a processing. Further, an increased production efficiency may be achieved since the time and labor to adjust a plurality of densitometers D in order to prevent non-uniformity are not necessary. Furthermore, a simplified configuration, and consequently, a cost reduction may be achieved since it is not necessary to provide the densitometer D for each of the plurality of tanks T.

(2) At least one of the heating unit H, the dilution unit I, and the new-liquid supply unit J is provided for each of the plurality of tanks T in order to control the concentration of the processing liquid L for each of the tanks T. An appropriate concentration adjustment depending on the magnitude of a fluctuation in the concentration of each tank T becomes possible since the plurality of tanks T are measured by one densitometer D and the concentration of the processing liquid L in the plurality of tanks T may be individually controlled according to the respective measured values.

(3) A measurement time interval of the densitometer D is set for each of the plurality of tanks T. For this reason, the concentration may easily converge to the target value by changing the length of the measurement time interval and the frequency of measurement for each tank T according to the magnitude of a required adjustment amount of the concentration in each tank T. In this way, one densitometer D may be effectively used for the concentration measurement and concentration control of the plurality of tanks T.

(4) The control device E controls the heating unit H and the dilution unit I by calculating an output of the heating unit H and an addition amount of the diluent, based on either or both of a difference between a measured value and the target value and an amount of change in the measured value. For this reason, the concentration of the processing liquid L may be controlled in consideration of a fluctuation in the concentration due to the replenishment of the processing liquid L to each tank T as well as the convergence of the concentration to the target value.

(5) The plurality of tanks T include a supply tank T1 configured to supply the processing liquid L to the processing device 100, a recovery tank T2 configured to recover the processing liquid L used in the processing device 100, a buffer tank T3 arranged between the recovery tank T2 and the supply tank T1, and a new-liquid tank T4 configured to supply a new processing liquid L. Therefore, the plurality of tanks T, which need to supply the processing liquid L always having a stable concentration as in the single-wafer type processing device 100, may be individually and optimally controlled.

[Modifications]

The above embodiment may also configure the following modifications.

Figure 4:
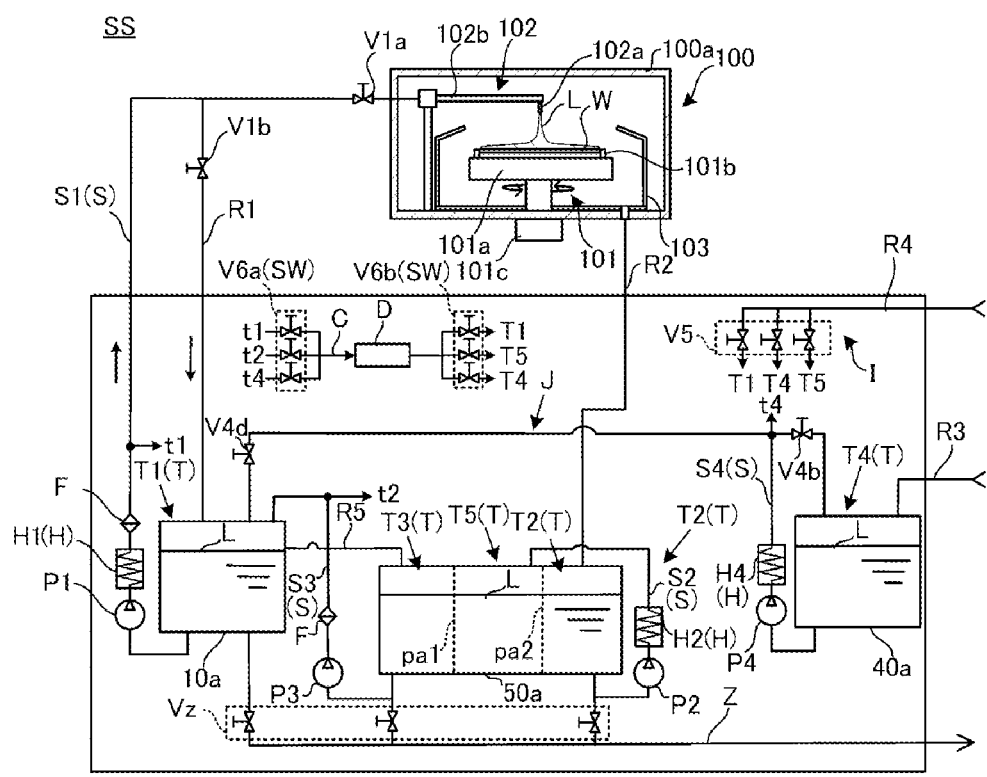
FIG. 4 is a schematic diagram illustrating a configuration of a modification of a processing device and a processing liquid supply device.

(1) Each tank T is sufficient as long as it is a region for storing the processing liquid L, and does not necessarily a separate independent container. For example, in FIG. 4, one container 50a may be provided with partitions pa1 and pa2 to function one side section as the recovery tank T2, the other side section as the buffer tank T3, and a middle section as a common tank T5. Each of the partitions pa1 and pa2 is partially provided with a notch to enable the passage of the processing liquid L. The processing liquid L of the recovery tank T2 is sucked by the pump P2, so that the processing liquid L flows from the common tank T5 to the recovery tank T2. Similarly, the processing liquid L of the buffer tank T3 is sucked by the pump P3, so that the processing liquid L flows from the common tank T5 to the buffer tank T3.

The processing liquid L (recovered liquid) used completely for a processing is introduced into the recovery tank T2 through the recovery pipe R2. This liquid is recovered in a low temperature state. Then, the recovered liquid is sucked by the pump P2, is heated by the heater H2, and is sent to the common tank T5 through the supply pipe S2. The recovered liquid heated by the heater H2 rises in temperature and is also increased in concentration by moisture evaporation. As a result, the recovered liquid has an increased concentration when introduced into the common tank T5, compared to that when recovered to the recovery tank T2.

The processing liquid L of the buffer tank T3 sucked by the pump P3 is sent to the supply tank T1, but the processing liquid L exceeding a certain liquid level in the supply tank T1 is returned to the buffer tank T3 through the return pipe R5. The processing liquid L in the supply tank T1 is controlled by heating and the addition of pure water so as to be maintained at the target concentration. For this reason, the concentration of the processing liquid L in the buffer tank T3 may be brought close to the concentration of the processing liquid L in the supply tank T1 by returning the excessive processing liquid of the supply tank T1 to the buffer tank T3.

In this way, the concentration control and temperature control may be performed until the tank T1 may be replenished with the processing liquid L by locally heating a portion of one container 50a. Even such a configuration of the tank T enables required concentration control by performing the concentration measurement and the heating and dilution depending on the measured concentration.

(2) In the above aspect, all of the tanks T1 to T4 are set to undergo concentration measurement, but only some of the tanks T may not undergo concentration measurement. For example, the amount of liquid in the recovery tank T2 fluctuates greatly since a constant amount of liquid is not always recovered into the recovery tank T2. Such a fluctuation in the amount of liquid causes a great fluctuation in the concentration of the processing liquid L in the recovery tank T2. As described above, since the recovery tank T2 has great fluctuations in the amount and concentration of the recovered liquid and the concentration control in the buffer tank T3 may be sufficient, the concentration measurement for the recovery tank T2 may be omitted. Further, the concentration in some of the tanks T is not normally measured, but control by the concentration measurement may be effectually performed when there is a possibility of a large change in the concentration, for example, when the replenished amount of the processing liquid L is different from usual.

(3) In the above aspect, the processing liquid L is diluted by adding water, but dilution, that is, a reduction in the concentration may be realized by adding a new liquid having a low concentration. Furthermore, the target concentration for the buffer tank T3 or the recovery tank T2 needs not to match the target concentration for the supply tank T1 since it is necessary only to be able to control the concentration and temperature of the processing liquid L when supplied to the processing device 100 to predetermined values. In other words, the target concentration may be changed for each tank T. For example, when the heating capacity of the heater H1 is high, the temperature and concentration of the processing liquid L in the buffer tank T3 may be low. In particular, there is no problem even if the concentration for the buffer tank T3 is slightly lower than the target concentration for the supply tank T1. This is because, even if the processing liquid L, which has a lower temperature and a lower concentration than the target concentration, flows from the buffer tank T3 to the supply tank T1, the concentration may be easily adjusted to the target concentration as long as the heater H1, which heats the processing liquid L circulating in the supply tank T1 has a high capacity.

(4) The above aspect illustrates the common flow path C configured to sequentially switch and flow the processing liquid L between the respective tanks T, but additional control for adding the cleaning time of the densitometer may be incorporated in the common flow path C by connecting a cleaning liquid supply circuit that cleans the interior of the densitometer D. In other words, the densitometer D may be cleaned by controlling the flow of a cleaning liquid from the cleaning liquid supply circuit into the densitometer D for each substrate processing time or every predetermined number of substrate processing times. This may contribute to maintain the accuracy of the densitometer D and to increase the lifespan of the densitometer D.

The common flow path C may be provided with a flow path for directly draining water to the discharge path Z via a valve Vz. Thus, the cleaning liquid may flow to the discharge path Z by opening the valve Vz upon cleaning of the densitometer D. In addition, since a processing of substituting the previous processing liquid L is performed for the first fixed period of time during which the liquid flows from each tank T to the densitometer D, the ON/OFF timing of the valve Vz may be set to flow the liquid to the discharge path z without returning it to the tank T.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A processing liquid supply device comprising;
   a plurality of tanks each configured to store a processing liquid;
   a supply path configured to connect the plurality of tanks so as to enable the processing liquid to pass between the plurality of tanks and to supply the processing liquid to a processing device that processes a substrate with the processing liquid, by sequentially passing through the plurality of tanks;
   a heater configured to heat the processing liquid;
   a diluter configured to dilute the processing liquid with a diluent;
   a new-liquid supply configured to supply a new-processing liquid;
   a common flow path through which the processing liquid of the plurality of tanks passes;
   a switch configured to switch between the plurality of tanks so that at least a tank is selected from which the processing liquid passes to the common flow path;
   a densitometer provided in the common flow path; and
   a controller configured to cause the densitometer to measure a concentration of the processing liquid in each of the plurality of tanks while switching between the plurality of tanks by the switch, and to control at least one of the heater, the diluter, and the new-liquid supply so that the concentration of the processing liquid reaches a target value set in advance.

2. The processing liquid supply device according to claim 1, wherein at least one of the heater, the diluter, and the new-liquid supply is provided for each of the plurality of tanks in order to control the concentration of the processing liquid for each of the tanks.

3. The processing liquid supply device according to claim 1, wherein a measurement time interval of the densitometer is set for each of the plurality of tanks.

4. The processing liquid supply device according to claim 1, wherein the controller controls the heater and the diluter by calculating an output of the heater and an addition amount of the diluent, based on either or both of a difference between a measured value of the densitometer and the target value and an amount of change in the measured value.

5. The processing liquid supply device according to claim 1, wherein the plurality of tanks include:
   a supply tank configured to supply the processing liquid to the processing device;
   a recovery tank configured to recover the processing liquid used in the processing device;
   a buffer tank arranged between the recovery tank and the supply tank; and
   a new-liquid tank configured to supply a new-processing liquid.

6. A substrate processing apparatus comprising:
   a processing device configured to process a substrate; and
   the processing liquid supply device according to claim 1.

7. A method of supplying a processing liquid, the method comprising;
   supplying a processing liquid to a processing device that processes a substrate with the processing liquid, by sequentially passing through a plurality of tanks,
   measuring a concentration of the processing liquid for each of the plurality of tanks by a densitometer provided in a common flow path through which the processing liquid of the plurality of tanks passes while switching between the plurality of tanks so that a specific tank is selected from which the processing liquid passes to the common flow path; and
   adjusting the concentration of the processing liquid by controlling at least one of a heater configured to heat the processing liquid, a diluter configured to dilute the processing liquid, and a new-liquid supply configured to supply a new processing liquid so that the concentration of the processing liquid reaches a target value set in advance.

8. The method according to claim 7, wherein the concentration of the processing liquid is adjusted for each of the plurality of tanks by controlling at least one of the heater, the diluter, and the new-liquid supply.

9. The method according to claim 7, wherein a time interval of measurement by the densitometer is a time interval set for each of the plurality of tanks.

* * * * *